219-121
8/9/83 XR 4,397,147

United States Patent [19]

Turchi

[11] 4,397,147
[45] Aug. 9, 1983

[54] POWER CIRCUIT UTILIZING SELF EXCITED HALL EFFECT SWITCH MEANS

[75] Inventor: Peter J. Turchi, Alexandria, Va.

[73] Assignee: The United States of America as represented by the Secretary of the Air Force, Washington, D.C.

[21] Appl. No.: 189,237

[22] Filed: Sep. 22, 1980

[51] Int. Cl.[3] ........................ F03H 1/00; H03K 17/90

[52] U.S. Cl. .............................. 60/202; 219/121 PW; 307/309; 315/111.41

[58] Field of Search .............................. 60/202, 203.1; 315/111.41, 111.21; 219/121 PW; 307/309

[56] References Cited

U.S. PATENT DOCUMENTS

| | | | |
|---|---|---|---|
| 2,856,532 | 10/1958 | Martina | 60/202 |
| 3,259,755 | 7/1966 | Weiss | 307/309 |
| 3,447,322 | 6/1969 | Mastrup | 219/121 PW X |
| 3,577,030 | 5/1971 | Cusick | 315/111.21 |

OTHER PUBLICATIONS

Vondra et al., "Analysis of Solid Teflon Pulsed Plasma Thruster", *J. Spacecraft*, (12-1970).

*Primary Examiner*—Carlton R. Croyle
*Assistant Examiner*—Donald E. Stout
*Attorney, Agent, or Firm*—Donald J. Singer; Willard R. Matthews

[57] ABSTRACT

A power circuit utilizing a switch comprised of Hall-effect-active resistive elements for interrupting a current flow in an inductive energy storage system. Interruption of the flow of current causes a high-voltage pulse which drives the current flow into a circuit leg which is parallel to the interrupting elements. The Hall effect switch is controlled by means of an exciter coil that is connected in parallel with the Hall-effect-active resistive elements to provide self excited operation.

4 Claims, 6 Drawing Figures

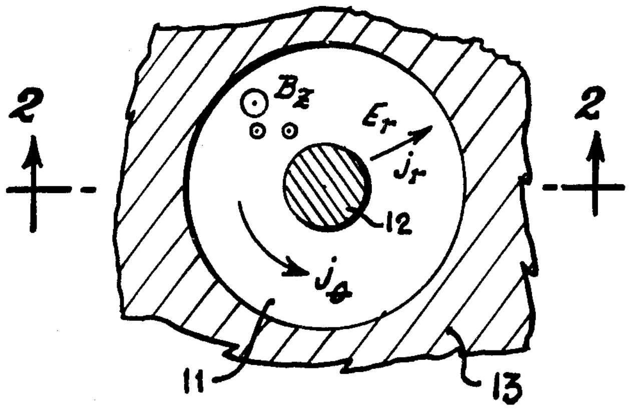
FIG. 1
FIG. 2
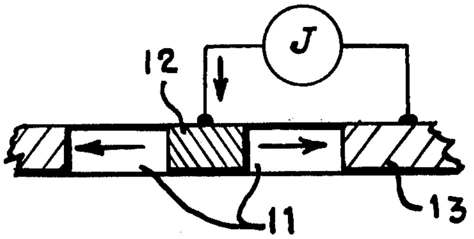
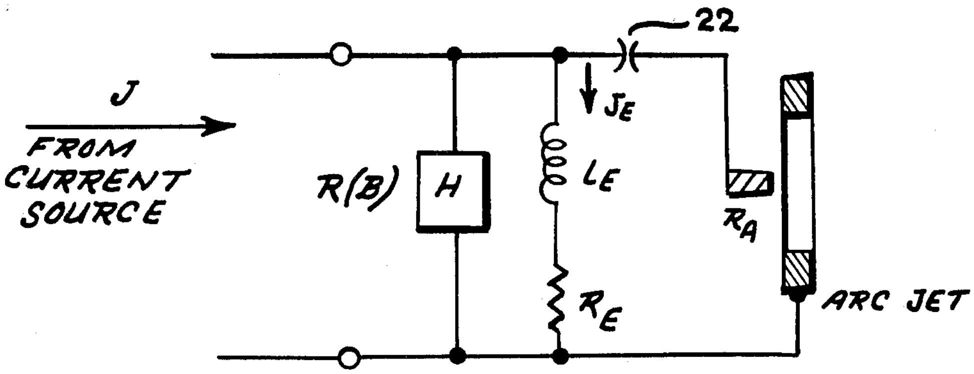
FIG. 3

POWER CIRCUIT UTILIZING SELF EXCITED HALL EFFECT SWITCH MEANS

STATEMENT OF GOVERNMENT INTEREST

The invention described herein may be manufactured and used by or for the Government for governmental purposes without the payment of any royalty thereon.

BACKGROUND OF THE INVENTION

This invention relates to power circuits for quasi-steady plasma thrusters and in particular to the implementation of such circuits with self excited Hall effect switching means. Plasma thruster devices of the type to which the invention pertains are well known and have been described in detail in the literature. An example is the periodical article of Kenn E. Clarke and Robert G. Jahn entitled "Quasi-Steady Plasma Acceleration" published in *AIAA Journal,* Volume 8. No. 2 pp 216–220, February 1970.

Various space missions such as satellite orbit control and spececraft maneuvering would benefit from high specific impulse, high thrust density plasma thrusters. Although the use of plasma flows for such spacecraft propulsion and satellite maneuvering has been discussed and demonstrated, a practical application of the technique has not been realized. This is because a basic limitation on the use of electrically created plasma flows for such thruster applications is the need for electrical power suitable for driving the plasma thruster. That is, in order to achieve the advantages of high efficiency in plasma thrusters it is important to operate at high power levels. In particular, steady operation of plasma thrusters at high efficiency requires steady power levels in the megawatt range, which is usually beyond spacecraft capabilities. This problem of limited total spacecraft power can be overcome by employing a train of quasi-steady current pulses at high power, with interpulse times adjusted to match the available, steady electric power. Such repetitive pulsed operation requires power conditioning to provide high power pulses from low power steady sources. In earth-based laboratory environments, various techniques, such as oil-filled or electrolytic capacitor banks in pulse-forming networks, including triggered spark-gaps, have been used for electric thruster research and development. For spacecraft applications at high power levels and long mission-durations, such laboratory techniques are not satisfactory because of weight limitations and reliability. That is, the principal limitations and/or disadvantages of older methods may be summarized as: high weight and volume for capacitive energy storage; and, complexity (therefore low reliability) for repetitive, high voltge spark-gaps and related circuitry for producing a train of high power pulses.

Accordingly, power circuitry that is not subject to these limitations is needed to convert steady electrical power to a train of high power pulses. Such circuitry must be compact and lightweight in order to satisfy mission constraints. The power circuits based on the Hall effect, comprehended by the present invention, can provide the necessary power conditioning for spacecraft applications, quasi-steady plasma thruster research, and, incidentally, other applications requiring pulse trains at megawatt power levels.

SUMMARY OF THE INVENTION

The invention comprehends a Hall effect power circuit for driving plasma thrusters and the like. The power circuit comprises leads from an electrical current source that are shorted by a self excited Hall effect switch. The Hall effect switch includes a Hall effect active element means such as a Corbino disc connected in parallel with its magnetic field producing exciter coil. The plasma thruster or other driven device is connected in parallel with the Hall effect switch. The resistance of the exciter coil circuit can be adjusted to match the peak resistance of the Hall effect active element to the impedance of the driven element. A second Hall effect switch can also be included in the exciter coil circuit to provide rapid cutoff of current to the driven element. A high current contactor in parallel with the Hall effect active element extends the time separation between power pulses and reduces dissipation in the Hall effect active element.

In operation, current from the current source initially flows mainly through the Hall effect active element. Current flow through the exciter coil produces a magnetic field perpendicular to the flow of current through the Hall effect active element increasing the active element resistance and reducing the current flow through it. This in turn causes more current to flow through the exciter coil. The magnetic field thus builds up increasing the resistance of the Hall effect active element and ultimately causing an interruption of current flow resulting in a high voltage pulse which drives the current flow into the circuit containing the plasma thruster.

It is a principal object of the invention to provide a new and improved self excited Hall effect switch.

It is another object of the invention to provide a new and improved Hall effect power circuit for driving plasma thrusters.

It is another object of the invention to provide a Hall effect power circuit that has low weight, smaller volume and reduced complexity compared to capacitively driven circuits and externally powered inductively switched systems.

It is another object of the invention to provide a Hall effect power circuit that is less complex and hence more reliable than currently available power circuits.

It is another object of the invention to provide a Hall effect power circuit that will automatically provide a long interval between high power pulses, nearly steady current during the power pulse and rapid cut-off of power at the end of the power pulse.

These together with other objects features and advantages of the invention will become more readily apparent from the following detailed description when taken in conjunction with the illustrative embodiment in the accompanying drawings.

DESCRIPTION OF THE DRAWINGS

FIG. 1 is a plan view of a Corbino disc type Hall effect active element;

FIG. 2 is a sectional view of the Hall effect active element of FIG. 1 taken at 2—2;

FIG. 3 is a schematic diagram of one embodiment of the Hall effect power circuit of the invention;

DETAILED DESCRIPTION OF THE PREFERRED EMBODIMENT

Figure 4:
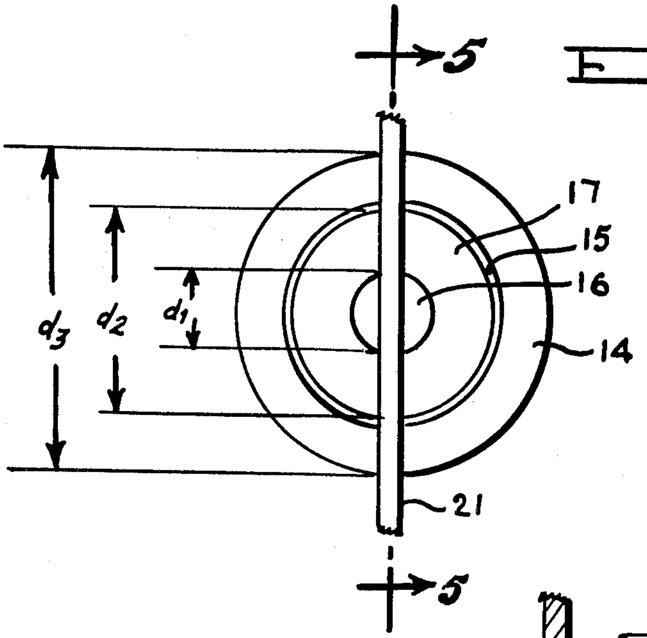
FIG. 4 is a plan view of one embodiment of the self excited Hall switch of the invention.

The invention comprehends a novel self excited Hall effect switch and power circuits that incorporate such a switch. These circuits find great utility in spacecraft applications such as plasma thrusters where weight, size and reliability considerations are of importance.

In the Hall effect power circuit for quasi-steady plasma thrusters described herein, the necessary power pulse to the thruster is created by using Hall effect active resistive elements to interrupt the current flow in an inductive energy storage system. Interruption of current flow results in a high voltage pulse which drives the current flow into a circuit leg parallel to the interrupting elements; the new circuit leg contains the thruster so energy is thereby delivered to the plasma thruster flow. The operation of the Hall effect active elements as resistive current-interrupters depends on the application of high magnetic fields perpendicular to the current flow in the Hall element. The basic Hall element and its current flow are shown in FIGS. 1 and 2 in a configuration called a Corbino disc. The current flows radially, and a magnetic field $B_z$ is applied axially to increase the effective resistance to radial current flow.

Referring to FIGS. 1 and 2 the Corbino disc 11 is annular in form and electrical connections are made through contacts 12 and 13. The resistance R of the Corbino disc is derived as follows:

taking Ohm's Law $\vec{E} = \eta\vec{j} - \vec{u_e} \times \vec{B}$ assuming only N type carriers $\vec{u_e} = -\vec{j}/ne$ there results $\vec{E} = \eta\vec{j} + \vec{j} \times \vec{B}/ne$ for the Corbino disc $E_\theta = O,\ \vec{B} \approx B\hat{k}$ $$\eta j_\theta = j_r B/ne$$

$$E_r = \eta j_r + j_\theta B/ne$$

$$= \eta j_r + j_r B^2/\eta n^2 e^2$$

$$= \eta j_r (1 + K^2B^2)$$

-continued and the resistance $R = R_o(1 + K^2B^2)$

The basic Hall effect power circuit for plasma thruster (designated ARCJET) application is shown in FIG. 3. The Hall effect element is labelled H, carrying current J from an inductive source (not shown) and spark gap means 22 is included in the arcjet circuit. The circuit equation for the power circuit of FIG. 3 is stated and derived as follows:

circuit equation: $L_E \frac{dJ_E}{dt} = R_o(1 + C^2J_E^2)\,J$ normalized: $\frac{dj}{d\tau} = (1 + C^2J^2j^2)$ WITH $j = J_E/J$, $\tau = R_ot/LE$ solution: $j = (CJ)^{-1}\text{TAN}\ CJ\tau$ $$\tau_f = \frac{j_f}{(\alpha - 1)^{\frac{1}{2}}}\ \text{TAN}^{-1}(\alpha - 1)^{\frac{1}{2}}\ \text{WHERE}\ \alpha = R_f/R_o$$

$$= 5.3 \times 10^{-3}\ \text{FOR}\ j_f = 0.05\ \text{AND}\ \alpha = 200$$

thereby providing 10% to full voltage in $\Delta\tau = 5.3\times10^{-4}$.

An important feature of the Hall effect power circuit is the use of the voltage developed across the Hall effect element to power the excitation field magnet, labelled as inductor $L_E$, carrying current $J_E$. In this way, additional cost, weight, and complexity for a separate magnet power supply is avoided. The use of such as a "self-excited" circuit also provides an automatic spacing between pulses to the plasma thruster, thereby providing the pulsetrain timing for quasi-steady operation. That is, most of the voltage pulse occurs in the last several percent of the Hall element switching action, with little voltage developed earlier.

By including a resistor, $R_E$ in series with the inductor $L_E$, it is possible to match the peak resistance of the Hall effect element to the impedance of the arcjet so the output current pulse during quasi-steady arcjet operation will be nearly constant (as required for quasi-steady operation). Some of this series resistance is provided automatically by the magnet winding associated with inductance $L_E$. An example of circuit values for quasi-steady plasma thruster applications is given in the following Table I.

TABLE I

| | | | | |
|---|---|---|---|---|
| CIRCUIT PARAMETERS: | $\zeta = 500$ | $j_f = 0.05$ | $\alpha = 200$ | Q = 21.9 |
| ARCJET PARAMETERS: | $R_A = 8\text{m}\Omega$ | $J_A = 25\text{kA}$ | $V_A = 200\text{V}$ | |
| DERIVED CIRCUIT VALUES: | $R_o = 0.28\text{m}\Omega$ | J = 28.6kA | $V_o = 8.0\text{V}$ | SWITCH CLOSED |
| | $\alpha R_o = 56\text{m}\Omega$ | J = 28.6kA | V = 1,600V | SWITCH OPENED |
| | $R_{Eo} = 140\text{m}\Omega$ | $J_{Ef} = 1.43\text{kA}$ | | |
| NORMALIZED TIMES: | $\tau_f = 0.02$ | 10% TO FULL VOLTAGE | | $\Delta\tau = 6.7 \times 10^{-4}$ $\Delta\tau/\tau_f \cong 3\%$ |

Figure 5:
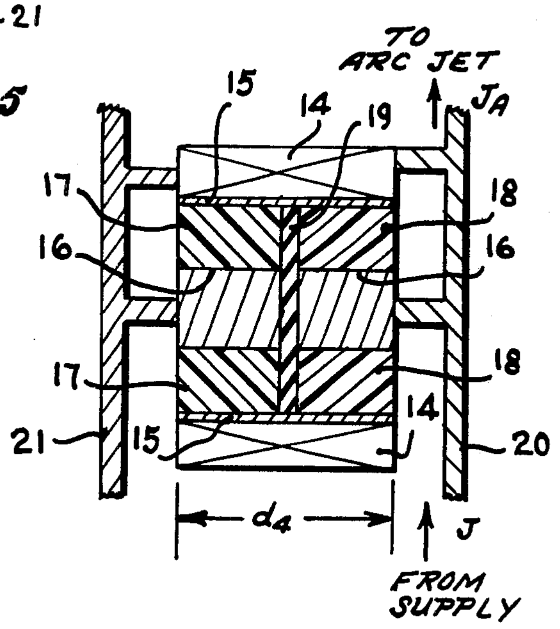
FIG. 5 is a sectional view of the self excited Hall switch of FIG. 4 taken at 5—5; and, FIG. 6 is a schematic diagram of another embodiment of the Hall effect power circuit of the invention.

A self excited Hall effect switch which corresponds to the circuit operation of Table I is illustrated by FIGS. 4 and 5. The switch comprises exciter coil 14, Hall effect material Corbino discs 17, 18, inner contact 16, outer contact 15, insulator 19 and input and output leads

20, 21. Actual geometries for the Hall effect element and excitation magnet will depend on specific application requirements; in particular, heat transfer and rejection in space environments will probably require an array of Hall effect elements rather than a single unit as shown. By way of example in the Hall effect switch of FIGS. 4 and 5: with d1=2 cm, d2=5.4 cm, d3=8.2 cm, d4=5.4 cm $$L_E/R_o \approx 1 \text{ sec}$$

$$\tau_f = \tau_f L_E/R_o \approx 20 \text{ msec}$$

producing 10% to full voltage $\Delta\tau = 674$ μsec.

Figure 6:
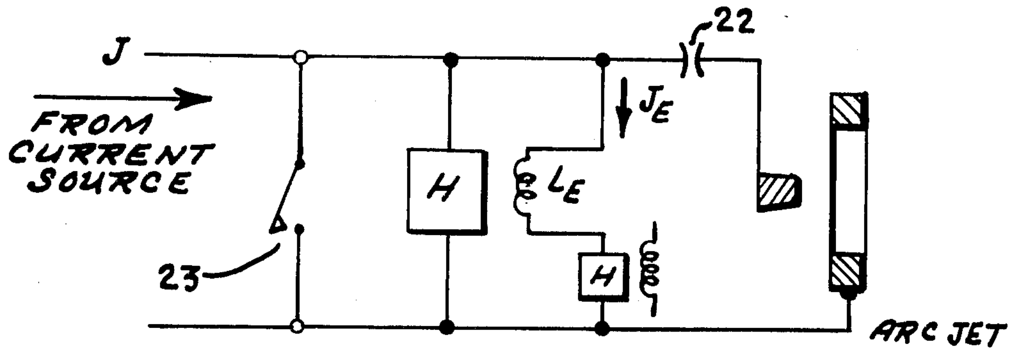

In order to provide for rapid cut-off of current to the arcjet at the end of the prescribed current pulse, it is useful to reduce the excitation field on the Hall effect element quickly. This can be done using additional Hall effect elements in series with the excitation magnet ($L_E$) as shown in FIG. 6. Such auxiliary Hall effect switching would be externally excited (using either mechanically-displaced permanent magnets or small capacitor-driven coils). Also shown in FIG. 6 is a low voltage, high current contactor 23 in parallel with the main Hall effect element, which can be used to extend the time separation between power pulses and/or reduce the dissipation in the Hall effect element between power pulses.

The operation of the circuit shown in FIG. 6 is the following. With $J_E \approx 0$, the contactor 23 is opened while shunted by the magnetic field-free Hall effect switch, H, thereby avoiding significant arcing at the contacts. The resistance of the Hall effect switch begins to drive current $J_E$ through the excitation coil $L_E$, thereby increasing the resistance of the Hall effect switch and the rate of increase of $J_E$. In the last several percent of this self-excited action, a voltage spike is developed of sufficient magnitude (~2 kV) to breakdown the sparkgap and the input-gas flow in the arcjet. Quasi-steady conditions are quickly attained in the arcjet at an impedance such that nearly constant current is diverted from the hall effect switch to the arcjet. After a prescribed power pulsetime, the auxiliary Hall effect active element is excited, quickly forcing the exciter current $J_E$ to low values, thereby allowing the Hall effect switch to shunt the arcjet at low resistance values, cutting off the arcjet current. With low voltage across the Hall effect switch, the contactor 23 can be reclosed and circuit operation can then be repeated after the desired interval of time.

The Hall effect power circuit described above has the advantages of low weight, small volume, and reduced complexity compared to capacitively-driven circuits and externally-powered (vs self-excited) inductively-switched systems. It provides for the use of self-excitation in conjunction with the arcjet impedance variation to provide automatically a long interval between high power pulses, nearly steady current during the power pulse and rapid cut-off of power at the end of the power pulse. It also provides for the use of self-excitation (and de-excitation) to allow a parallel high current contactor to operate without significant arcing on opening and closing.

While the invention has been described in its preferred embodiment it is understood that the words which have been used are words of description rather than words of limitation and that changes within the purview of the appended claims may be made without departing from the scope and spirit of the invention in its broader aspects. For example, various particular arrangements of Hall effect elements (series/parallel arrays, for example) can be employed in the same circuit arrangement to satisfy specific requirements (such as spacecraft heat transfer constraints). Various Hall effect active materials can be employed with appropriate changes in the values of excitation field, current, pulsetimes, etc. Additional switches, resistors and other electrical circuit elements can be incorporated with the Hall effect power circuit to adjust current distributions, rise and fall times, heat dissipation, etc. without changing the basic operation of the circuit.

What is claimed is:

1. In a plasma thruster having arc jet electrodes, a current source and a power circuit including a spark gap connecting said current source to said arc jet electrodes, the improvement residing in a Hall effect switch means, said Hall effect switch means comprising a self excited Hall effect switch connected across said power circuit and in parallel with said spark gap, said Hall effect switch comprising Hall effect active element means having terminals for connection into said power circuit to effect the passage of electrical current through said Hall effect active element means, and magnetic field means including an exciter coil for providing a magnetic field perpendicular to the electrical current flow in said Hall effect active element means, said exciter coil being connected in parallel with said Hall effect active element means and controlling the magnitude of said perpendicular magnetic field in response to electrical current flowing through said exciter coil.

2. A Hall effect power circuit as defined in claim 1 including resistor means in series with said exciter coil, said resistor means being sized to match the peak resistance of said Hall effect active element to the impedance of said spark gap.

3. A Hall effect power circuit as defined in claim 2 including a second Hall effect switch means in series with said exciter coil.

4. A Hall effect power circuit as defined in claim 3 including a high current contactor across said first and second input terminals.

* * * * *